US010826429B2

(12) United States Patent
Chang et al.

(10) Patent No.: US 10,826,429 B2
(45) Date of Patent: Nov. 3, 2020

(54) COMPENSATION MODULE, OSCILLATION CIRCUIT, AND ASSOCIATED COMPENSATION METHOD CAPABLE OF REDUCING SENSITIVITY OF OUTPUT OSCILLATION SIGNAL

(71) Applicant: MEDIATEK Inc., Hsin-Chu (TW)

(72) Inventors: Keng-Meng Chang, Hsinchu (TW); Yun-Chen Chuang, Hsinchu (TW); Yao-Chi Wang, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 53 days.

(21) Appl. No.: 16/172,926

(22) Filed: Oct. 29, 2018

(65) Prior Publication Data

US 2019/0165730 A1    May 30, 2019

Related U.S. Application Data

(60) Provisional application No. 62/591,840, filed on Nov. 29, 2017.

(51) Int. Cl.
| | |
|---|---|
| H03B 5/12 | (2006.01) |
| H03B 5/04 | (2006.01) |
| H03L 7/099 | (2006.01) |
| H03L 1/00 | (2006.01) |
| H02M 3/158 | (2006.01) |

(52) U.S. Cl.
CPC ............ *H03B 5/1228* (2013.01); *H03B 5/04* (2013.01); *H03B 5/129* (2013.01); *H03B 5/1243* (2013.01); *H03B 5/1253* (2013.01); *H03B 5/1293* (2013.01); *H03L 1/00* (2013.01); *H03L 7/099* (2013.01); *H02M 3/158* (2013.01); *H03B 2200/0062* (2013.01)

(58) Field of Classification Search
CPC ............... H03B 5/1253; H03B 5/129; H03B 2200/0062; H03B 5/1228; H03B 5/04; H03B 5/1243; H03B 5/1293; H02M 3/158
USPC .................. 331/185, 34, 177 V, 167, 117 FE
See application file for complete search history.

(56) References Cited

U.S. PATENT DOCUMENTS

| | | | |
|---|---|---|---|
| 5,483,205 A | * | 1/1996 | Kawamura ............... H03K 3/03 331/74 |
| 7,365,610 B2 | | 4/2008 | Zhang |
| 7,492,228 B2 | | 2/2009 | Strange |
| 8,981,862 B2 | | 3/2015 | Liu et al. |

(Continued)

*Primary Examiner* — Arnold M Kinkead
(74) *Attorney, Agent, or Firm* — McClure, Qualey & Rodack, LLP (57) ABSTRACT

A compensation module, an oscillation circuit and associated compensation method for reducing an oscillation frequency variation in an output oscillation signal of a voltage-controlled oscillator (VCO) core are provided. The compensation module includes a compensation circuit and a polarity selection circuit. The compensation circuit has a capacitance value related to voltages of a first and a second receiving terminals. The oscillation frequency variation is changed with the capacitance value. The polarity selection circuit conducts a periodic regulated signal to one of the first receiving terminal and the second receiving terminal. The polarity selection circuit conducts a filtered bias signal to the other of the first receiving terminal and the second receiving terminal. The periodic regulated signal is sensitive to a regulated voltage variation, and the filtered bias signal is insensitive to the regulated voltage variation.

20 Claims, 7 Drawing Sheets

(56) References Cited

U.S. PATENT DOCUMENTS

2013/0002358 A1  1/2013  Mitchell et al.
2014/0292301 A1  10/2014 Lee et al.

\* cited by examiner

COMPENSATION MODULE, OSCILLATION CIRCUIT, AND ASSOCIATED COMPENSATION METHOD CAPABLE OF REDUCING SENSITIVITY OF OUTPUT OSCILLATION SIGNAL

This application claims the benefit of U.S. provisional application Ser. No. 62/591,840, filed Nov. 29, 2017, the disclosure of which is incorporated by reference herein in its entirety.

TECHNICAL FIELD

The disclosure relates in general to a compensation module, an oscillation circuit, and associated compensation method, and more particularly to a compensation module, an oscillation circuit and associated compensation method capable of reducing the sensitivity of output oscillation signal.

BACKGROUND

A voltage-controlled oscillator (hereinafter, VCO) in a phase-locked loop (hereinafter, PLL) circuits can produce an output oscillation signal Vout with a frequency defined as the output oscillation frequency fout. For an inductor-capacitor (hereinafter, LC) tank based VCO, changes of capacitance value result in changes of the output oscillation frequency fout.

When a supply voltage Vdd supplied to the VCO changes, the output oscillation frequency fout changes and such changes are referring to as "frequency pushing." Alternatively speaking, frequency pushing refers to the change in the output oscillation frequency fout due to a variation in supply voltage Vdd. Since the VCO is sensitive to noise on the supply voltage Vdd, the frequency change results in phase change, and a communication device using the PLL circuit may not meet the specification.

SUMMARY

The disclosure is directed to a compensation module, an oscillation circuit, and an associated compensation method.

According to one embodiment, a compensation module is provided. The compensation module includes a compensation circuit and a polarity selection circuit.

According to another embodiment, an oscillation circuit is provided. The oscillation circuit includes a voltage-controlled oscillator (VCO) core, the compensation module, and a calibration circuit.

According to still another embodiment, a compensation method applied to the oscillation circuit including the VCO core, the compensation module, and the calibration circuit is provided.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1:
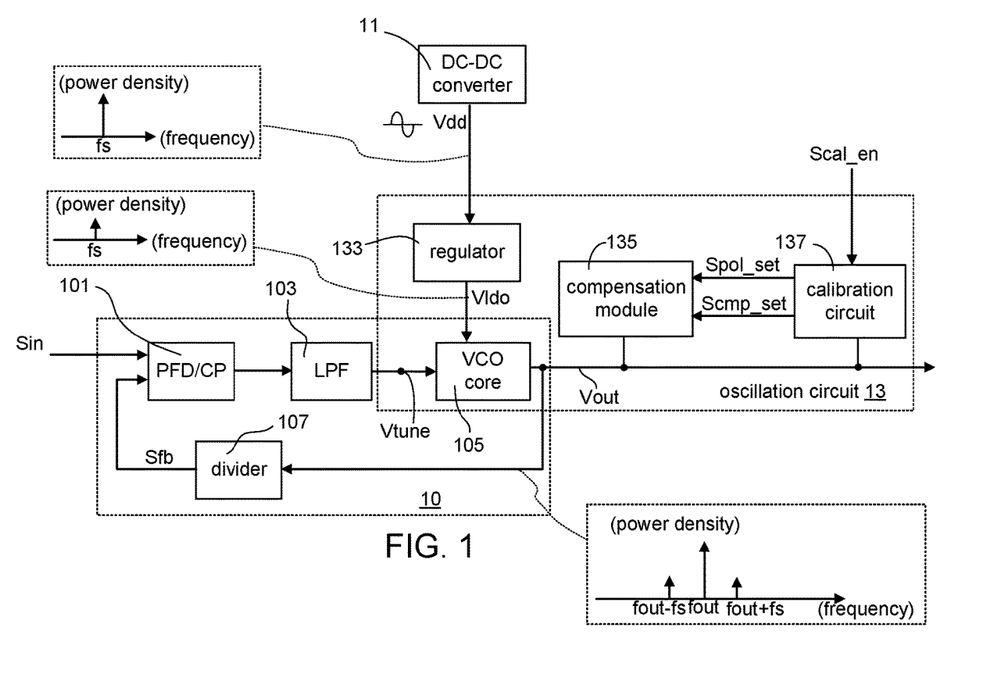
FIG. 1 is a block diagram illustrating the application of a VCO core in a phase-locked loop circuit.

FIG. 1 is a block diagram illustrating a phase-locked loop and operations of a VCO core of the phase-locked loop. The PLL circuit 10 includes a phase frequency detector (hereinafter, PFD) or a charge pump (hereinafter, CP) 101, a loop filter 103, a voltage-controlled oscillator (VCO) core 105 and a divider 107.

In the PLL circuit 10, the PFD/CP 101 receives an input signal Sin and a feedback signal Sfb and accordingly generates a phase/frequency difference between the input signal Sin and the feedback signal Sfb. The phase/frequency difference is transmitted to the loop filter 103. Then, the loop filter 103 provides a tuning signal Vtune to the VCO core 110 to vary the output oscillation signal Vout of the VCO core 110 in accordance with the tuning signal Vtune. The output oscillation signal Vout is divided by the divider 107 to generate the feedback signal Sfb.

The PLL circuit 10 is used with a DC-to-DC converter 11 (for example, a buck converter) and a regulator 133 (for example, a low dropout linear regulator (hereafter, LDO)). The DC-to-DC converter 11 converts a source voltage (Vsrc) to a supply voltage Vdd, and the DC-to-DC converter 11 provides a supply voltage Vdd to the regulator 133. The DC-to-DC converter 11 provides the supply voltage Vdd to many components in an electronic device.

After receiving the supply voltage Vdd from the DC-to-DC converter 11, the regulator 133 generates and provides a periodic regulated signal Vldo to the VCO core 105. As shown in the frequency domain, amplitude of the spurious signal Sspur is depressed after the regulator 133.

The VCO core 105 receives the tuning signal Vtune from the loop filter 103 as its input and generates the output oscillation signal Vout accordingly. The VCO core 105 is coupled to the regulator 133 and a ground terminal Gnd.

The VCO core 105 up-converts the depressed spurious signal Sspur with the output oscillation frequency fout. The frequency domain corresponding to the output of the VCO core 105 shows that spectra of the spurious signal Sspur exist at two sides of the spectrum of the output oscillation frequency fout. This is frequency pushing phenomenon.

As mentioned above, the frequency pushing phenomenon implies that the output oscillation frequency fout varies with changes of the supply voltage Vdd. Therefore, the frequency pushing can be represented in terms of Hz/V.

In one embodiment of the present disclosure, a compensation module 135 and a calibration circuit 137 capable of neutralizing the native frequency pushing are provided. As shown in FIG. 1, an oscillation circuit 13 including the compensation module 135, the calibration circuit 137, the regulator 133 and the VCO core 105 is defined. When the calibration circuit 137 receives a calibration enable signal Scal_en, the calibration circuit 137 initiates a calibration procedure and generates a polarity setting signal Spol_set and a compensation setting signal Scmp_set accordingly. The polarity setting signal Spol_set is related to the polarity of the native frequency pushing of the VCO core 105, and the compensation setting signal Scmp_set is related to the amount of the native frequency pushing of the VCO core 105.

Figure 2:
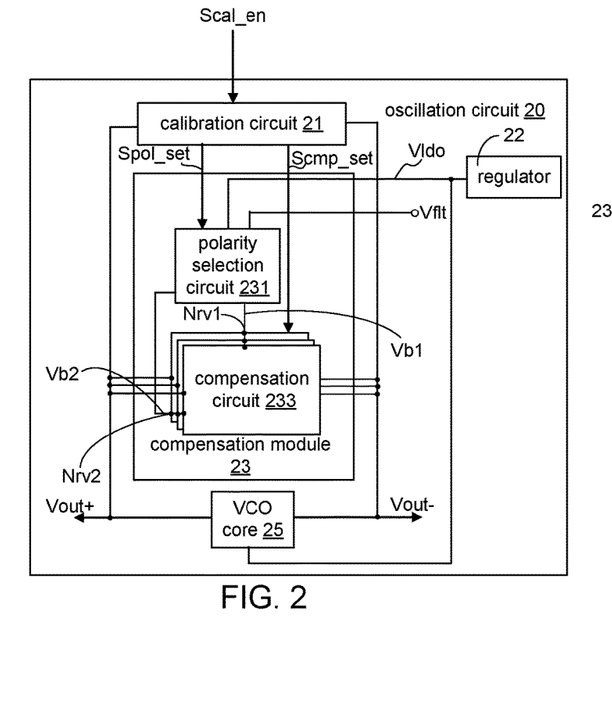
FIG. 2 is a schematic diagram illustrating an oscillation circuit according to the embodiment of the present disclosure.

FIG. 2 is a schematic diagram illustrating an oscillation circuit according to the embodiment of the present disclosure. The oscillation circuit 20 includes a VCO core 25, a calibration circuit 21 and a compensation module 23. The compensation module 23 further includes compensation circuits 233 and a polarity selection circuit 231, and the compensation circuits 233 are coupled to the polarity selection circuit 231.

The compensation module 23 provides a compensation frequency pushing to the VCO core 105 to minimize the overall compensation frequency pushing of the oscillation circuit 20.

In one embodiment of the present disclosure, each of the compensation circuits 233 has a pair of symmetric varactors. The symmetric varactors have a capacitance value which is changed with the difference between two bias voltages, and such a feature is used in the compensation circuits 233 to provide the compensation frequency pushing. With the varactors, the compensation module 23 is capable of dynamically adjusting the amount of compensation frequency pushing by changing the capacitance value of the varactor(s).

The polarity selection circuit 231 and the compensation circuits 233 are coupled to the calibration circuit 21. From the calibration circuit 21, the polarity selection circuit 231 receives the polarity setting signal Spol_set. The polarity setting signal Spol_set represents the polarity of compensation frequency pushing. On the other hand, the compensation circuits 233 receive a compensation setting signal Scmp_set from the calibration circuit 21. The compensation setting signal Scmp_set implies the amount of the compensation frequency pushing, which is used for determining the number of compensation circuits being enabled.

In one embodiment of the present disclosure, the calibration circuit 21 and the compensation circuits 233 are coupled to the VCO core 25 and receive a pair of the output oscillation signals (Vout+, Vout−) from the VCO core 25. The polarity selection circuit 231 is coupled to the regulator 22. The regulator 22 transmits the periodic regulated signal Vldo to the polarity selection circuit 231 and the VCO core 25.

Depending on the polarity of native frequency pushing, connections of the polarity selection circuit 231 may vary. When the native frequency pushing has the positive polarity, the polarity selection circuit 231 is set so that the compensation frequency pushing has negative polarity. When the native frequency pushing has the negative polarity, the polarity selection circuit 231 is set so that the compensation frequency pushing has the positive polarity.

The calibration circuit 137 may perform a calibration algorithm, for example, a binary search algorithm. The calibration algorithm can be recursively performed to evaluate whether the amount of compensation frequency pushing is actually close to the amount of native frequency pushing. The compensation setting signal Scmp_set is utilized to determine the number of compensation circuits 233 being enabled according to the calibration result.

The compensation circuits 233 are coupled to the polarity selection circuit 231 through the first receiving terminal Nrv1 and the second receiving terminal Nrv2. The voltage of the first receiving terminal Nrv1 can be defined as the first bias voltage Vb1, and the voltage of the second receiving terminal Nrv2 can be defined as the second bias voltage Vb2. In response to the compensation setting signal Scmp_set, the number of compensation circuits 233 being enabled changes.

Moreover, each of the compensation circuits 233 is coupled to the VCO core 25. The capacitance value of the compensation circuits 233 may change the output oscillation frequency font when the compensation circuits 233 are enabled by the compensation setting signal Scmp_set. The frequency pushing caused by a compensation circuit 233 is defined as a unit compensation frequency pushing.

Therefore, once the calibration circuit 21 determines an estimated amount of compensation frequency pushing based on the calibration algorithm, the calibration circuit 21 generates the compensation setting signal Scmp_set to control the number of the compensation circuits 233 being enabled. The amount of compensation frequency pushing corresponding to the compensation module 23 is equivalent to a summation of the unit compensation frequency pushing of the compensation circuits 233 which are enabled.

Figure 3:
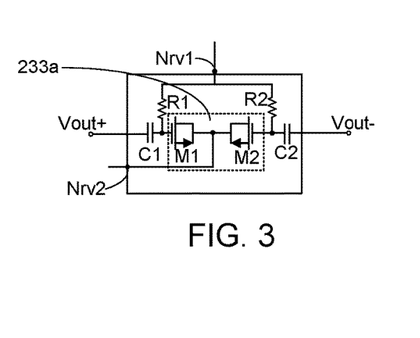
FIG. 3 is a schematic diagram illustrating an exemplary compensation circuit.

FIG. 3 is a schematic diagram illustrating an exemplary compensation circuit. The compensation circuit 233 includes a first receiving terminal Nrv1, a second receiving terminal Nrv2, a varactor component 233a that includes two symmetric varactors, resistors R1, R2, and capacitors C1, C2. Each of the transistors M1, M2 has a first terminal (drain), a second terminal (source), and a control terminal (gate). Although the symmetric varactors are assumed to be NMOS transistors M1, M2 in FIG. 3, the varactors can be PMOS transistors, diodes, or any other types of varactors in practical application.

As shown in FIG. 3, the first and the second terminals of the transistors M1, M2 are jointly coupled to the second receiving terminal Nrv2. The control terminal of the transistor M1 is coupled to a terminal of the capacitor C1 and a terminal of the resistor R1, and the control terminal of the transistor M2 is coupled a terminal of the capacitor C2 and a terminal of the resistor R2. The other terminals of the capacitors C1 C2 are coupled to the VCO core 25, and the other terminals of the resistors R1, R2 are coupled to the first receiving terminal Nrv1.

Figure 4A:
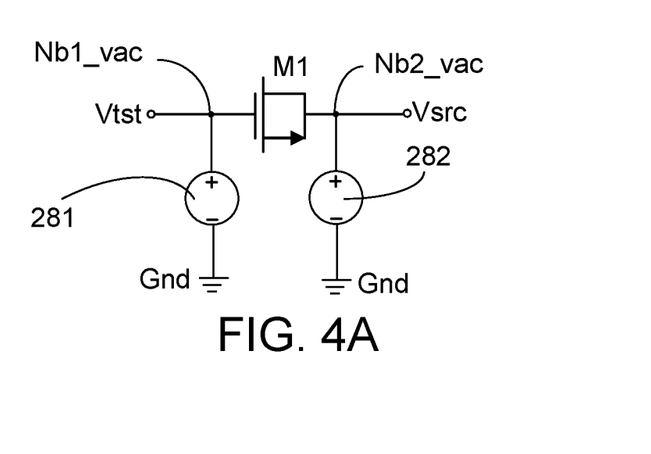
FIG. 4A is a schematic diagram illustrating an NMOS varactor.

FIG. 4A is a schematic diagram illustrating an NMOS varactor. The NMOS varactor (that is, transistor M1) has two bias terminals Nb1_vac, Nb2_vac, and the capacitance value of the NMOS varactor is changed with the voltage difference between the bias terminals Nb1_vac, Nb2_vac.

The control terminal (gate) of the transistor M1 is coupled to the first bias terminal Nb1_vac and a first voltage source 281. The first voltage source 281 provides a testing voltage Vtst to the bias terminal Nb1_vac. The first and the second terminals (source and drain) of the transistor M1 are coupled to the bias terminal Nb2_vac and a second voltage source 282. The second voltage source 282 provides a source voltage Vsrc to the bias terminal Nb1_vac.

Characteristic of the NMOS varactor can be found by repetitively changing the voltage difference between the testing voltage Vtst and the source voltage Vsrc. The voltage difference between the source voltage Vsrc and the testing voltage Vtst can be defined as a bias voltage difference $\Delta Vbs$ ($\Delta Vbs=Vtst-Vsrc$).

In one embodiment, the source voltage Vsrc can be set to the fixed value, and the testing voltage Vtst can be respectively set to various values to generate different values of the bias voltage difference $\Delta Vbs$. According to FIG. 4A, changes of the testing voltage Vtst implies voltage variation at the control terminal of the transistor M1. Thus, the varactor capacitor is positively related to the increase of the testing voltage Vtst.

Figure 4B:
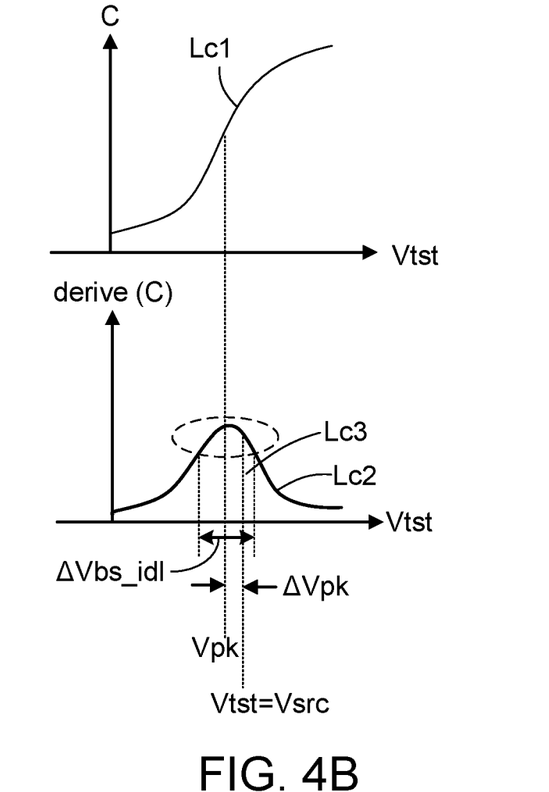
FIG. 4B is a schematic diagram illustrating a characteristic of the NMOS varactor.

FIG. 4B is a schematic diagram illustrating a characteristic of the NMOS varactor shown in FIG. 4A. The curve Lc1 shown in the upper part of FIG. 4B represents changes of the varactor capacitance versus the testing voltage Vtst. The curve Lc1 shows that the varactor capacitance increases with the increase of the testing voltage Vtst. The slope of the curve Lc1 remains to be positive, regardless of the steepness changes of the curve Lc1.

The cure Lc2 shown in lower part of FIG. 4B can be obtained by differentiating the curve Lc1. As the slope of the curve Lc1 is always positive, the curve Lc2 remains to be positive, and a peak derived capacitance occurs when the testing voltage is equivalent to a peak voltage Vpk.

The peak value of the curve Lc2 indicates that the NMOS varactor can provide a maximum amount of compensation frequency pushing. Therefore, an ideal operation range $\Delta Vbs\_idl$ centered at the peak voltage Vpk is defined. The ideal operation range $\Delta Vbs\_idl$ is utilized to limit the range of the testing voltage Vtst. Thus, the testing voltage Vtst is preferred to be greater than or equivalent to (Vpk−½*$\Delta Vbs\_idl$) and to be less than or equivalent to (Vpk+½*$\Delta Vbs\_idl$), that is, (Vpk−½*$\Delta Vbs\_idl$)≤Vtst≤(Vpk+½*$\Delta Vbs\_idl$).

The dotted line Lc3 shows the case when the testing voltage Vtst is equivalent to the source voltage Vsrc, and a peak voltage difference $\Delta Vpk$ represents the difference between the peak voltage and the source voltage Vsrc. The peak voltage difference $\Delta Vpk$ can be greater than, equivalent to or greater than half of the ideal operation range ½*Vbs_idl. That is, $\Delta Vpk<$½*$\Delta Vbs\_idl$, $\Delta Vpk=$½*$\Delta Vbs\_idl$, or $\Delta Vpk>$½*$\Delta Vbs\_idl$. Moreover, the peak voltage Vpk is determined by the feature of the NMOS varactor, and it can be less than, equivalent to, or greater than the source voltage Vsrc.

When the control terminal of the transistor M1 receives the variable voltage value (testing voltage Vtst) and the first and the second terminals of the transistor M1 receives the fixed voltage (source voltage Vsrc), changes of the varactor capacitance are accompanied with the negative frequency pushing. Similarly, changes of the varactor capacitance result in the positive frequency pushing when the control terminal of the transistor M1 receives the fixed voltage value (source voltage Vsrc) and the first and the second terminals of the transistor M1 receive variable voltage value (testing voltage Vtst).

Basically, how the voltages are applied to terminals of the transistor M1 dominates the polarity of unit compensation frequency pushing, and the difference between the voltages being applied to the terminals of the transistor M1 is related to the amount of the unit compensation frequency pushing. Such concepts are further utilized in the embodiment of the present disclosure.

As shown in FIG. 3, the transistor M1 is used in the varactor component 233a, the voltage received at the control terminal of the transistor M1 is conducted from the first receiving terminal Nrv1, and the voltage received at the first and the second terminals of the transistor M1 is conducted from the second receiving terminal Nrv2. In addition, the testing voltage Vtst can be analog to the periodic regulated signal Vldo because they both are variable, and the source voltage Vsrc can be analog to the filtered bias signal Vflt because they both have the fixed (stable) voltage value.

Therefore, the control terminal of the transistor M1 receives the variable voltage value when the first receiving terminal Nrv1 receives the periodic regulated signal Vldo, through and the first and the second terminals of the transistor receives the fixed (stable) voltage value when the second receiving terminal Nrv2 receives the filtered bias signal Vflt. Under such circumstances, an increase of the periodic regulated signal Vldo results in increases of the varactor capacitance and the compensation frequency pushing caused by the varactor capacitor has negative polarity.

On the other hand, the control terminal of the transistor M1 receives the fixed (stable) voltage value when the first receiving terminal Nrv1 receives the filtered bias signal Vflt and the first and the second terminals of the transistor receives the variable voltage value when the second receiving terminal Nrv2 receives the periodic regulated signal Vldo. Under such circumstances, an increase of the periodic regulated signal Vldo results in decreases of the varactor capacitance and the compensation frequency pushing caused by the varactor capacitor has positive polarity.

Furthermore, according to the embodiment of the present disclosure, it is desired to control the periodic regulated signal Vldo to be within the ideal operation range $\Delta Vbs\_idl$. That is, (Vpk−½*$\Delta Vbs\_idl$)≤Vldo≤(Vpk+½*$\Delta Vbs\_idl$). To be more precise, the NMOS varactor can provide the maximum compensation frequency pushing when the periodic regulated signal Vldo is set to be equivalent to the peak voltage Vpk. By knowing the ideal operation range $\Delta Vbs\_idl$ and the peak voltage Vpk of the NMOS varactor, which are related to the feature of the NMOS varactor, in advance and appropriately controlling the periodic regulated signal Vldo, the compensation effect of the varactor capacitance can be raised.

Figure 5:
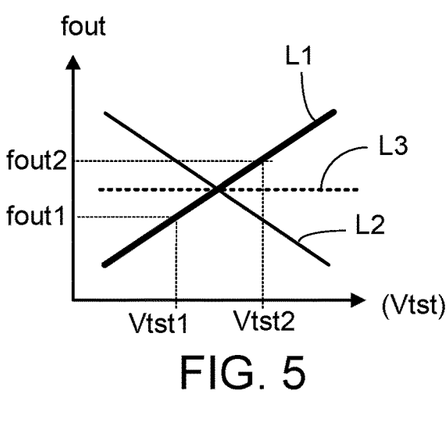
FIG. 5 is a schematic diagram illustrating the compensation frequency pushing having negative polarity compensates the VCO core whose native frequency pushing having positive polarity.

FIG. 5 is a schematic diagram illustrating the compensation frequency pushing having negative polarity compensates the VCO core whose native frequency pushing having positive polarity.

In a case that an oscillation frequency variation $\Delta fout$ increases when a regulated voltage variation $\Delta Vldo$ (changes of the periodic regulated signal Vldo) increases, the polarity of native frequency pushing is positive (line L1 has a positive slope). Thus, the polarity of compensation frequency pushing must be negative (line L2 has a negative slope). As line L2 represents the ideal compensation frequency pushing, the steepness of line L1 is equivalent to the steepness of line L2 although the directions of lines L1 and L2 are different.

Line L3 shows that, in an ideal case, the output oscillation frequency Pout remains unchanged (consistent) regardless of changes of the testing voltage Vtst. In other words, the overall frequency pushing of the oscillation circuit (slope of line L3) is equivalent to "0" based on a combination of the positive native frequency pushing (slope of line L1) and the ideal negative compensation frequency pushing (slope of line L2).

Figure 6:
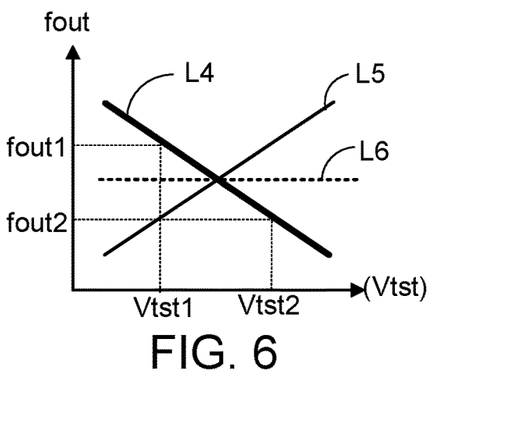
FIG. 6 is a schematic diagram illustrating the compensation frequency pushing having positive polarity compensates the VCO core whose native frequency pushing having negative polarity.

FIG. 6 is a schematic diagram illustrating the compensation frequency pushing having positive polarity compensates the VCO core whose native frequency pushing having negative polarity. The relationships between lines L4, L5 and L6 can be conducted as those of line L1, L2, and L3, except the polarities of native frequency pushing and compensation frequency pushing are different. Detail illustrations about FIG. 6 are omitted.

Figure 7:
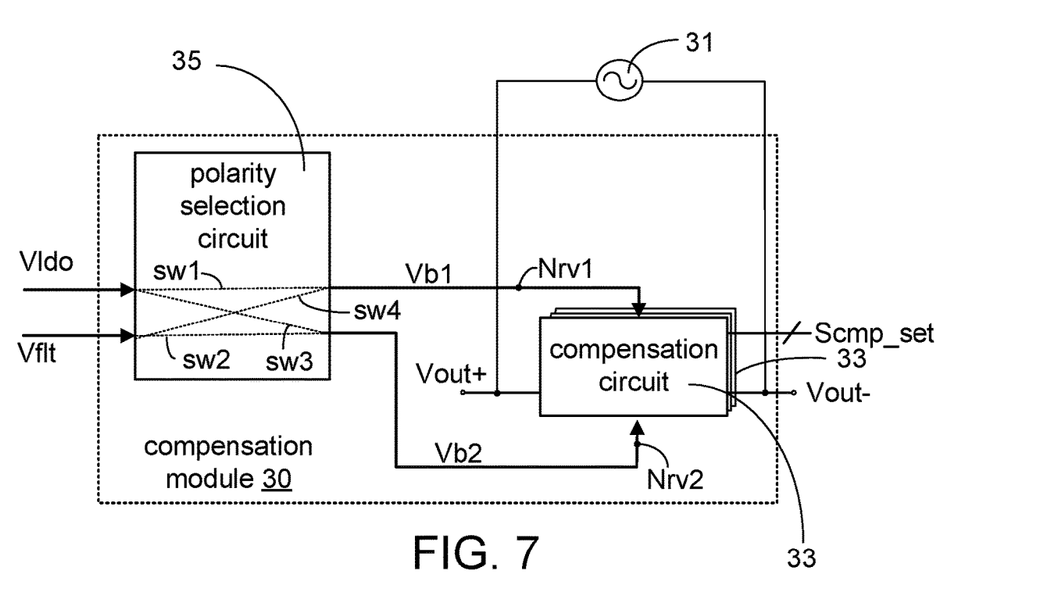
FIG. 7 is a block diagram schematically illustrating the compensation module according to an embodiment of the present disclosure.

FIG. 7 is a block diagram schematically illustrating the compensation module according to an embodiment of the present disclosure. The compensation module 30 has the polarity selection circuit 35 and the compensation circuit 33.

According to the embodiment of the present disclosure, the polarity selection circuit 35 includes four switches, sw1, sw2, sw3, sw4. The switches sw1, sw2 are defined as a first switch pair, and the switches sw3, sw4 are defined as a second switch pair.

The switch sw1 selectively conducts the periodic regulated signal Vldo to the first receiving terminal Nrv1; the switch sw2 selectively conducts the filtered bias signal Vflt to the second receiving terminal Nrv2. The switch sw3 selectively conducts the periodic regulated signal Vldo to the second receiving terminal Nrv2; the switch sw4 selectively conducts the filtered bias signal Vflt to the receiving terminal Nrv1.

Through the polarity selection circuit 35, one of the first receiving terminal Nrv1 and the second receiving terminal Nrv2 receives the periodic regulated signal Vldo, and the other one of the first receiving terminal Nrv1 and the second receiving terminal Nrv2 receives the filtered bias signal Vflt. Comparing with Vldo, the filtered bias signal Vflt is insensitive to the DC-to-DC ripple of the periodic regulated signal Vldo.

When the first receiving terminal Nrv1 receives the periodic regulated signal Vldo, the second receiving terminal Nrv2 receives the filtered bias signal Vflt. When the second receiving terminal Nrv2 receives the periodic regulated signal Vldo, the first receiving terminal Nrv1 receives the filtered bias signal Vflt. In other words, the switches in the second switch pair (switches sw3, sw4) are turned off when the switches in the first switch pair (switches sw1, sw2) are turned on, and the switches in the second switch pair (switches sw3, sw4) are turned on when the switches in the first switch pair (switches sw1, sw2) are turned off.

Each of the compensation circuits 33 has a capacitance value, and the capacitance value is related to voltages of the first receiving terminal Nrv1 and the second receiving terminal Nrv2. Because the compensation circuits 33 are coupled to the VCO core 31, changes of the capacitance values of the compensation circuits 33 directly cause the oscillation frequency variation Δfout. Thus, controlling the voltages at the first receiving terminal Nrv1 and the second receiving terminal Nrv2 implies changes of the capacitance value being provided by the compensation circuits 33, so as the oscillation frequency variation Δfout.

The number of compensation circuits 33 being enabled by the compensation setting signal Scmp_set is corresponding to the amount of compensation frequency pushing. When there are more compensation circuits 33 being enabled, the accumulated amount of compensation frequency pushing is greater and magnitudes of the slope of line L2 in FIG. 6 or line L5 in FIG. 7 becomes greater (steepness of line L2 and/or line L5 increases). When there are fewer compensation circuits 33 being enabled, the accumulated amount of compensation frequency pushing is less and magnitudes of the slope of line L2 in FIG. 5 or line L5 in FIG. 6 becomes less (steepness of line L2 and/or line L5 decreases).

According to the embodiment of the present disclosure, the switches sw1, sw2 are turned on, and the switches sw3, sw4 are turned off when the native frequency pushing has a positive polarity. Conduction of the switch sw1 provides the compensation frequency pushing having the negative polarity to the VCO core 31 for compensation, and conduction of the switch sw2 ensures that the signal received through the second receiving terminal Nrv2 does not cause any frequency pushing.

According to the embodiment of the present disclosure, the switches sw1, sw2 are turned off, and the switches sw3, sw4 are turned on when the native frequency pushing has a negative polarity. Conduction of the switch sw3 provides the compensation frequency pushing having positive pushing to the VCO core 31 for compensation, and conduction of the switch sw4 ensures that the signal received at the first receiving terminal Nrv1 does not cause any frequency pushing.

Figure 11:
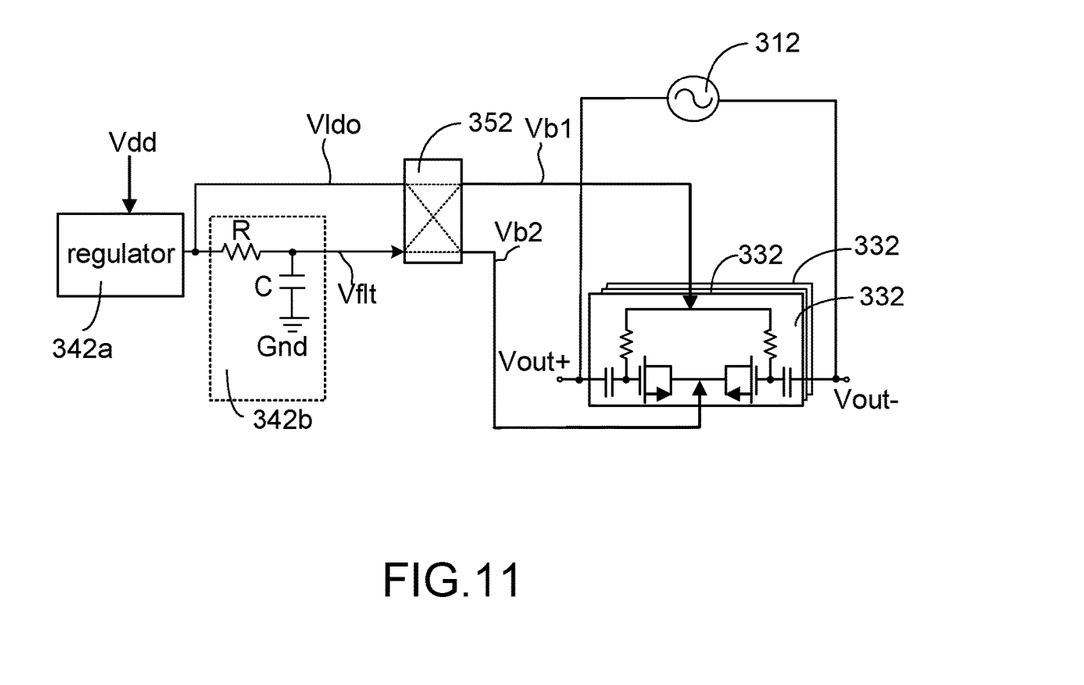
FIG. 11 is a schematic diagram illustrating a voltage source outside the regulator according to an embodiment of the present disclosure.
Figure 12:
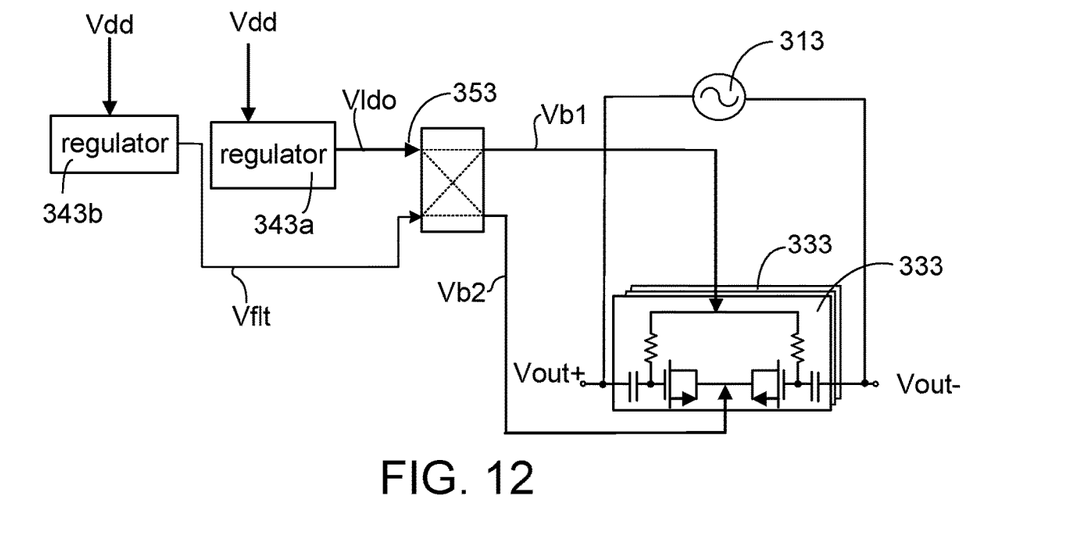
FIG. 12 is a schematic diagram illustrating the paralleling regulators are used to provide the periodic regulated signal Vldo and the filtered bias signal Vflt.

In addition to the periodic regulated signal Vldo, the polarity selection circuit 35 receives the filtered bias signal Vflt, and the filtered bias signal Vflt is required to be insensitive to the periodic regulated signal Vldo. For example, sources of the filtered bias signal Vflt includes but not limited to the three different types of implementation illustrated below, FIGS. 8, 9 and 10 correspond to a first type of the source of the filtered bias signal Vflt that originates from inside of the regulator providing the periodic regulated signal Vldo itself. FIG. 11 corresponds to a second type of the source of the filtered bias signal Vflt that originates from a source connected but outside the regulator providing the periodic regulated signal Vldo itself. FIG. 12 corresponds to a third type of the source of the filtered bias signal Vflt that originates from another regulator.

Figure 8:
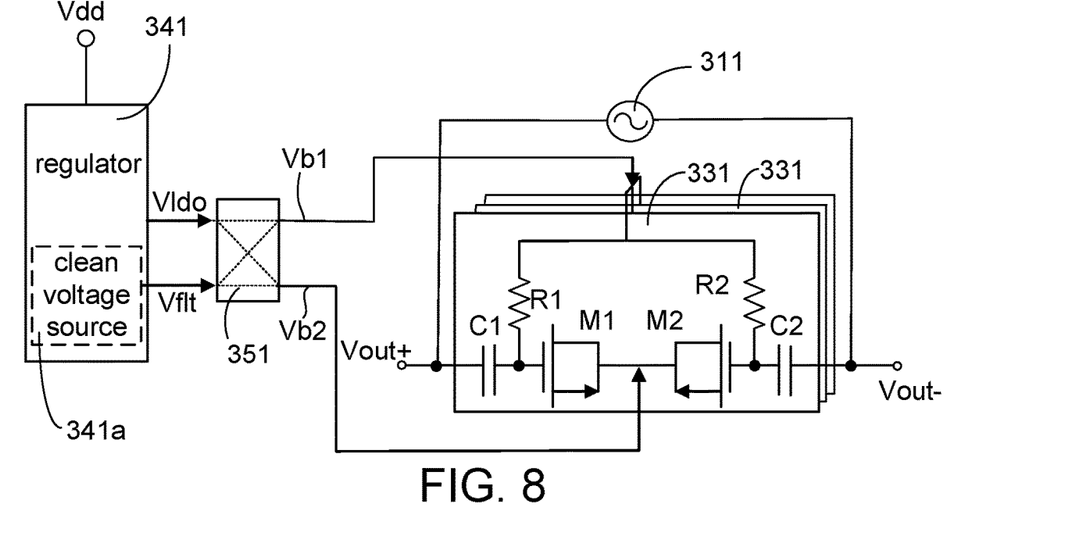
FIG. 8 is a schematic diagram illustrating the voltage source according to an embodiment of the present disclosure.

FIG. 8 is a schematic diagram illustrating the voltage source according to an embodiment of the present disclosure. A voltage source 341a is provided by the regulator 341. The voltage source 341a can be an existing terminal in the regulator 341 so that no extra circuit is required. The connections and operations of the VCO core 311, the compensation circuits 331, and the polarity selection circuit 351 are not repeatedly described.

Figure 9:
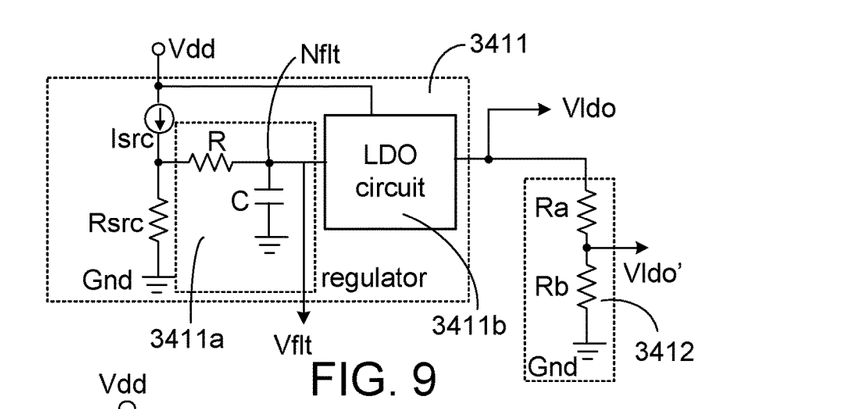
FIG. 9 is a schematic diagram illustrating an implementation of the voltage source shown in FIG. 8.

FIG. 9 is a schematic diagram illustrating an implementation of the voltage source shown in FIG. 8. A regulator 3411 includes an LDO circuit 3411b, a current source Isrc, a source resistor Rsrc, and a voltage source 3411a. The LDO circuit 3411b provides the periodic regulated signal Vldo, and the voltage source 3411a provides the filtered bias signal Vflt.

The voltage source 3411a can be an R-C filter including a resistor R, and a capacitor C. The current source Isrc is coupled to the supply voltage Vdd and the source resistor Rsrc, and the source resistor Rsrc is coupled to the voltage source and the ground terminal Gnd. The resistor R in the voltage source 3411a is coupled to the current source Isrc, the source resistor Rsrc, the capacitor C, and the LDO circuit 3411b. The capacitor C in the voltage source 3411a is coupled to the LDO circuit 3411b and the ground terminal Gnd.

With the R-C filter, the DC-to-DC ripple embedded in the supply voltage Vdd is dramatically suppressed. Thus, the filtered bias signal Vflt is insensitive to supply voltage Vdd compared to Vldo. According to the embodiment of the present disclosure, the R-C filter can be an existing R-C filter in the regulator 3411. That is, implementation of the voltage source 3411a does not cost extra circuit.

As mentioned in FIG. 4B, characteristic of the compensation circuit becomes stable and efficient when the difference between voltages of the first receiving terminal Nrv1 and the second receiving terminal Nrv2 within the ideal operation range ΔVbs_idl. Therefore, in some applications, instead of receiving the periodic regulated signal Vldo, the polarity selection circuit receives an adjusted periodic regulated signal Vldo'.

In FIG. 9, the regulator 3411 may be further coupled to a voltage divider 3412 including an R ladder (resistors Ra, Rb). The resistor Ra is coupled to the output of the regulator 3411 and the resistor Rb, and the resistor Rb is coupled to the ground terminal Gnd. By choosing the resistance values of the resistors Ra, Rb, the voltage difference between the filtered bias signal Vflt and the adjusted periodic regulated signal Vldo' can be maintained to be less than or equivalent to the ideal operation range ΔVbs_idl.

Figure 10:
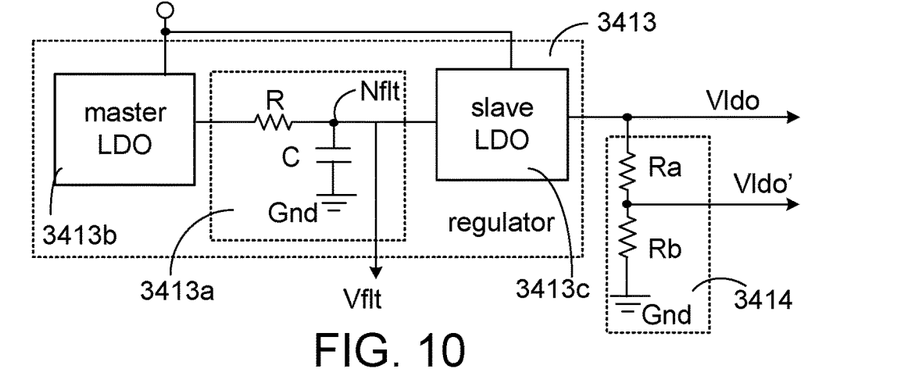
FIG. 10 is a schematic diagram illustrating another implementation of the voltage source shown in FIG. 8.

FIG. 10 is a schematic diagram illustrating another implementation of the voltage source shown in FIG. 8. The regulator 3413 includes a master LDO 3413b, a slave LDO 3413c, and a voltage source 3413a. The voltage source 3413a is an R-C filter including a resistor R and a capacitor C. The resistor R is coupled to the master LDO 3413b, the capacitor C, and the slave LDO 3413c. The capacitor C is coupled to the slave LDO 3413c and the ground terminal Gnd. Like FIG. 9, a voltage divider 3414 including resistors Ra, Rb can be used to generate the adjusted periodic regulated signal Vldo'.

In FIGS. 9 and 10, the signal at the filtered bias terminal Nflt is utilized as the filtered bias signal Vflt. The output of the regulator can be directly transmitted to the polarity selection circuit. Alternatively, in a case that the voltage divider is provided, the adjusted periodic regulated signal Vldo' can be acquired from the voltage divider. By using the adjusted periodic regulated signal Vldo', the performance of the compensation circuit can be enhanced.

FIG. 11 is a schematic diagram illustrating a voltage source outside the regulator according to an embodiment of the present disclosure. The connections and operations of the VCO core 312, the compensation circuits 332, and the polarity selection circuit 352 are not repeatedly described.

In some applications, magnitudes of the filtered bias signal Vflt (as the source voltage Vsrc in FIGS. 4A and 4B) and the peak voltage Vpk are very close or equivalent. This implies that the ideal operation range ΔVbs_idl may be very small, and there should be little or no difference between the DC values of the filtered bias signal Vflt and the periodic regulated signal Vldo. In consequence, an identical DC value can be used for both the periodic regulated signal Vldo and the filtered bias signal Vflt. The voltage source 342b shown in FIG. 11 directly utilizes the output of the regulator 342c as its input so that the periodic regulated signal Vldo and the filtered bias signal Vflt have same DC value.

The voltage source 342b receives the periodic regulated signal Vldo from the regulator 342a and generates the filtered bias signal Vflt based on the periodic regulated signal Vldo. The voltage source 342b can be an R-C filter including a resistor R and a capacitor C. The resistor R is coupled to the regulator 342a, the polarity selection circuit 352, and the capacitor C. The capacitor C is coupled to the ground terminal Gnd.

In some applications, it can be challenging to find an appropriate regulator to provide a relatively insensitive signal and a relatively sensitive signal at the same time. Therefore, paralleling regulators which are capable of distributing the heat and power loss, improving dropout voltage and improving the power supply rejection ratio (hereinafter, PSRR) performance may be used.

FIG. 12 is a schematic diagram illustrating the paralleling regulators are used to provide the periodic regulated signal Vldo and the filtered bias signal Vflt. The connections and operations of the VCO core 313, the compensation circuits 333, and the polarity selection circuit 353 are not repeatedly described.

Two regulators 343a, 343b are provided, and the regulator 343a is coupled to the VCO core 313 and the polarity selection circuit 353 for providing the periodic regulated signal Vldo. The regulator 343b is coupled to the polarity selection circuit 353 to provide the filtered bias signal Vflt. Relatively, the regulator 343b can be considered as the voltage source. Because the regulator 343b is not coupled to the VCO core 313, the operation of the regulator 343b is independent to the VCO core 313. Compared with the regulator 343a, the regulator 343b should have a better frequency pushing characteristic, that is, less sensitive to changes in the supply voltage Vdd.

Although some exemplary embodiments are mentioned above, the present disclosure may adopt some other alternatives and variations. As long as the periodic regulated signal Vldo is relatively sensitive to the supply voltage Vdd and the filtered bias signal Vflt is relatively insensitive to the supply voltage Vdd, the originations and the implementations of the periodic regulated signal Vldo and the filtered bias signal Vflt are not limited.

The amount of frequency pushing caused by the spurious signal Sspur when the frequency of the periodic regulated signal Vldo is in the operating frequency range is very close to that when the frequency of the periodic regulated signal Vldo is equivalent to zero (that is, when the periodic regulated signal Vldo is a DC signal). Because of this, a DC voltage change of the periodic regulated signal Vldo can be utilized to determine the native frequency pushing of the VCO core, and an (external) regulator capable of providing another DC voltage as the filtered bias signal Vflt is used in the calibration procedure.

Figure 13:
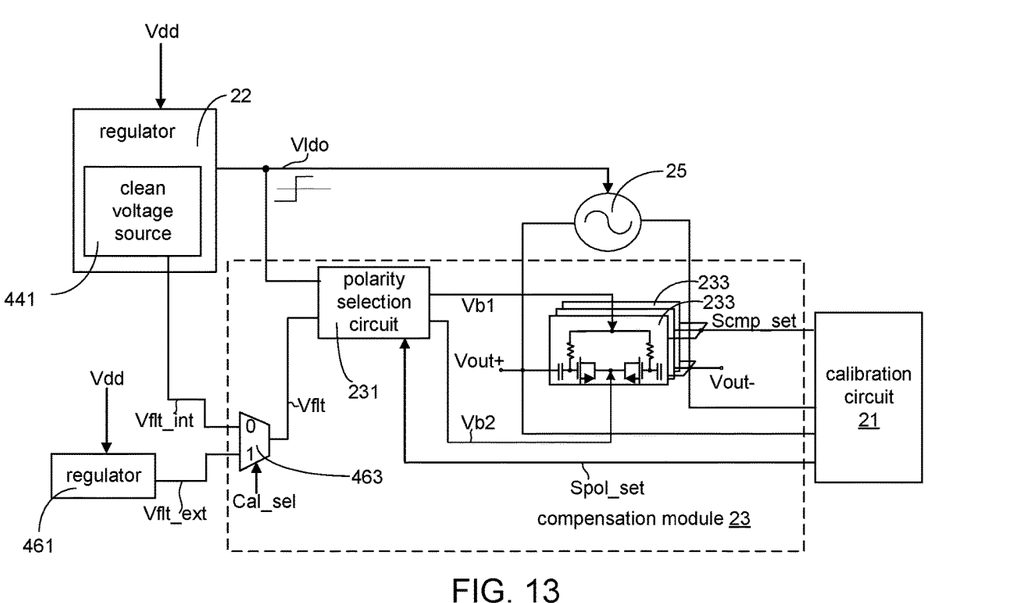
FIG. 13 is a schematic diagram illustrating that an isolated (external) regulator is used when the calibration circuit performs the calibration procedure.

FIG. 13 is a schematic diagram illustrating that an isolated (external) regulator is used for determining the calibration amount when the calibration circuit performs the calibration procedure. In FIG. 13, the compensation module 23 further includes a calibration selection circuit 463.

The calibration selection circuit 463 has two sources of inputs, that is, an internal filtered bias signal Vflt_int received from the voltage source 441 in the regulator 44 and an external filtered bias signal Vflt_ext received from the external regulator 461. The calibration selection circuit 463 transmits one of the internal filtered bias signal Vflt_int and the external filtered bias signal Vflt_ext as its output signal. The output signal of the calibration selection circuit 463 is further transmitted to the polarity selection circuit 231 as the filtered bias signal Vflt.

It is desired to precisely detect the amount of native frequency pushing. Therefore, the filtered bias signal Vflt being used during the calibration procedure is preferred to be completely independent of the periodic regulated signal Vldo so that the regulator 461 is adopted during the calibration procedure. As the regulators 22, 461 operate separately and independently, generation of the external filtered bias signal Vflt_ext is entirely independent of the periodic regulated signal Vldo.

According to the embodiment of the present disclosure, a calibration selection signal Cal_sel is generated by the calibration circuit 21. When the calibration circuit 21 executes the calibration procedure, the calibration selection signal Cal_sel is set to "1" (logic high) so that the calibration selection circuit 463 transmits the external filtered bias signal Vflt_ext to the polarity selection circuit 231. On the other hand, when the calibration circuit 21 suspends the calibration procedure, the calibration selection signal Cal_sel is set to "0" (logic low) so that the calibration selection circuit 463 transmits the internal filtered bias signal Vflt_int to the polarity selection circuit 231.

Unlike the assumption mentioned above that the internal filtered bias voltage Vflt_in should be less sensitive to supply voltage Vdd while compared with the periodic regulated signal Vldo, the external filtered bias voltage Vflt_ext provided by the external regulator during the calibration procedure is not required to have a relatively less sensitive feature than the periodic regulated signal Vldo. Alternatively speaking, even if the external filtered bias voltage Vflt_ext has a poorer frequency pushing (more sensitive to the supply voltage Vdd than the periodic regulator signal Vldo), the calibration procedure can still be performed in a similar manner by merely changing the polarity of compensation frequency pushing.

Furthermore, according to the embodiment of the present disclosure, the calibration procedure can be performed based on an open loop scheme and/or a closed loop scheme. In the open loop scheme, the VCO core 25 is disconnected from other components in the PLL. Thus, the output oscillation signal Vout of the VCO core 25 is evaluated to determine how the polarity setting signal Spol_set and the compensation setting signal Scmp_set should be set. In the closed-loop scheme, the VCO core 25 is connected to the other components in the PLL. Thus, the turning signal Vtune received from the loop filter is evaluated.

The embodiments according to the present disclosure can provide the compensation frequency pushing to the VCO core. With the calibration circuit and the compensation circuit, the output oscillation signal Vout of the VCO core in the oscillation circuit becomes insensitive to the DC-DC ripple. In consequence, the PLL circuit can meet the strict requirement of the frequency pushing.

The proposed architecture has switchable polarity of compensation frequency pushing and adjustable amount of compensation frequency pushing. Furthermore, the simulated results show that usage of the compensation module can dramatically reduce the integrated phase error of the VCO core. Furthermore, the use of the compensation module and the calibration circuit does not affect the design of the VCO core. Thus, the oscillation circuit according to the embodiment of the present disclosure can be freely applied to different types of the VCO core.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A compensation module comprising:
    a compensation circuit, coupled to a voltage-controlled oscillator (VCO) core, comprising:
        a first receiving terminal; and
        a second receiving terminal, wherein the compensation circuit has a capacitance value related to voltages of the first receiving terminal and the second receiving terminal; and
    a polarity selection circuit, coupled to a regulator and the compensation circuit, for receiving a periodic regulated signal generated by the regulator and a filtered bias signal, wherein the polarity selection circuit conducts the periodic regulated signal to one of the first receiving terminal and the second receiving terminal and conducts the filtered bias signal to the other of the first receiving terminal and the second receiving terminal.

2. The compensation module according to claim 1, wherein if an oscillation frequency variation in an output oscillation signal of the VCO core increases when a regulated voltage variation increases, the polarity selection circuit conducts the periodic regulated signal to the first receiving terminal and conducts the filtered bias signal to the second receiving terminal.

3. The compensation module according to claim 1, wherein if an oscillation frequency variation in an output oscillation signal of the VCO core increases when a regulated voltage variation decreases, the polarity selection circuit conducts the periodic regulated signal to the second receiving terminal and conducts the filtered bias signal to the first receiving terminal.

4. The compensation module according to claim 1, wherein the polarity selection circuit comprises:
    a first switch pair, comprising:
        a first switch, configured to selectively conduct the periodic regulated signal to the first receiving terminal;
        a second switch, configured to selectively conduct the filtered bias signal to the second receiving terminal;
    a second switch pair, comprising:
        a third switch, configured to selectively conduct the periodic regulated signal to the second receiving terminal;
        a fourth switch, configured to selectively conduct the filtered bias signal to the first receiving terminal, wherein
    the switches of the first switch pair are turned on when the switches of the second switch pair are turned off, and
    the switches of the first switch pair are turned off when the switches of the second switch pair are turned on.

5. The compensation module according to claim 1, wherein the compensation circuit further comprises: a first transistor, a second transistor, a first capacitor, a second capacitor, a first varactor, and a second varactor, wherein the first varactor is coupled to the first resistor and the first capacitor, the second varactor is coupled to the second resistor and the second capacitor, and the first varactor and the second varactor are symmetric.

6. The compensation module according to claim 5, wherein the first varactor and the second varactor are NMOS transistors, PMOS transistor, or diodes.

7. The compensation module according to claim 1, wherein the compensation module is coupled to a calibration circuit,
    wherein the calibration circuit is configured to generate a polarity setting signal to the polarity selection circuit and a compensation setting signal to the compensation circuit.

8. The compensation module according to claim 7, wherein the compensation circuit receives the filtered bias signal from another regulator while the calibration circuit performs a calibration procedure for generating the polarity setting signal and the compensation setting signal.

9. The compensation module according to claim 1, wherein the polarity selection circuit receives the filtered bias signal from a voltage source, and the voltage source is an R-C filter or another regulator.

10. An oscillation circuit, comprising:
a voltage-controlled oscillator (VCO) core, coupled to a regulator, configured to receive a periodic regulated signal from the regulator and generate an output oscillation signal;
a compensation circuit, coupled to the VCO core and the regulator, comprising:
a first receiving terminal; and
a second receiving terminal, wherein the compensation circuit has a capacitance value related to voltages of the first receiving terminal and the second receiving terminal; and
a polarity selection circuit, coupled to the regulator and the compensation circuit, configured to receive the periodic regulated signal and a filtered bias signal, wherein the polarity selection circuit conducts the periodic regulated signal to one of the first receiving terminal and the second receiving terminal and conducts the filtered bias signal to the other of the first receiving terminal and the second receiving terminal.

11. The oscillation circuit according to claim 10, wherein the polarity selection circuit comprises:
a first switch pair, comprising:
a first switch, configured to selectively conduct the periodic regulated signal to the first receiving terminal;
a second switch, configured to selectively conduct the filtered bias signal to the second receiving terminal;
a second switch pair, comprising:
a third switch, configured to selectively conduct the periodic regulated signal to the second receiving terminal;
a fourth switch, configured to selectively conduct the filtered bias signal to the first receiving terminal, wherein
the first switch and the second switch are turned on, and the third switch and the fourth switch are turned off if an oscillation frequency variation in the output oscillation signal increases when a regulated voltage variation increases, and
the first switch and the second switch are turned off, and the third switch and the fourth switch are turned on if the oscillation frequency variation in the output oscillation signal increases when the regulated voltage variation decreases.

12. The oscillation circuit according to claim 11, wherein the compensation circuit further comprises: a first transistor, a second transistor, a first capacitor, a second capacitor, a first varactor, and a second varactor, wherein the first varactor is coupled to the first resistor and the first capacitor, the second varactor is coupled to the second resistor and the second capacitor, and the first varactor and the second varactor are symmetric.

13. The oscillation circuit according to claim 12, wherein the first varactor and the second varactors are NMOS transistors, PMOS transistor, or diodes.

14. The oscillation circuit according to claim 10, wherein the compensation module coupled to a calibration circuit, wherein
the calibration circuit generates and transmits a polarity setting signal to the polarity selection circuit and a compensation setting signal to the compensation circuit.

15. The oscillation circuit according to claim 10, wherein the compensation circuit receives the filtered bias signal from another regulator when the calibration circuit performs a calibration procedure.

16. The oscillation circuit according to claim 10, wherein the polarity selection circuit receives the filtered bias signal from a voltage source, and the voltage source is an R-C filter or another regulator.

17. A compensation method applied to an oscillation circuit comprising a VCO core, a compensation module comprising a first receiving terminal and a second receiving terminal, and a calibration circuit, wherein the compensation method comprises steps of:
receiving a periodic regulated signal by the VCO core and the compensation moduel from the regulator, wherein the periodic regulated signal is received at one of the first receiving terminal and the second receiving terminal;
receiving a filtered bias signal by the compensation module, wherein the filtered bias signal is received at the other of the first receiving terminal and the second receiving terminal, and wherein a capacitance value of the compensation module is related to voltages of the first receiving terminal and the second receiving terminal; and
performing a calibration procedure by the calibration circuit to generate a polarity setting signal and a compensation setting signal, wherein the calibration circuit changes the voltages of the first receiving terminal and the second receiving terminal with the polarity setting signal and the compensation setting signal.

18. The compensation method according to claim 17, wherein the calibration circuit generates the polarity setting signal so that the compensation module conducts the periodic regulated signal to the first receiving terminal, and conducts the filtered bias signal to the second receiving terminal if an oscillation frequency variation in an output oscillation signal of the VCO core increases when a regulated voltage variation increases.

19. The compensation method according to claim 17, wherein
the calibration circuit generates the polarity setting signal so that the compensation module conducts the periodic regulated signal to the second receiving terminal, and conducts the filtered bias signal to the first receiving terminal if an oscillation frequency variation in an output oscillation signal of the VCO core increases when a regulated voltage variation decreases.

20. The compensation method according to claim 17, wherein the filtered bias signal is received from a voltage source, and the voltage source is an R-C filter or another regulator.

* * * * *